(12) United States Patent
Kobayashi et al.

(10) Patent No.: US 8,711,574 B2
(45) Date of Patent: Apr. 29, 2014

(54) ELECTRONIC DEVICE AND PRINTED CIRCUIT BOARD

(75) Inventors: Masahiro Kobayashi, Kazo (JP); Noriaki Sakamoto, Honjo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 13/402,700

(22) Filed: Feb. 22, 2012

(65) Prior Publication Data

US 2013/0003326 A1 Jan. 3, 2013

(30) Foreign Application Priority Data

Jun. 30, 2011 (JP) ................................. 2011-146576

(51) Int. Cl.
*H05K 7/14* (2006.01)
*H05K 7/18* (2006.01)

(52) U.S. Cl.
USPC .......................................... 361/799; 361/816

(58) Field of Classification Search
USPC .................. 361/799, 816, 818, 803
See application file for complete search history.

(56) References Cited

U.S. PATENT DOCUMENTS

| | | | | |
|---|---|---|---|---|
| 5,550,713 A | * | 8/1996 | Pressler et al. | 361/818 |
| 5,946,199 A | * | 8/1999 | Matsuzaki | 361/818 |
| 6,689,670 B2 | * | 2/2004 | Kawanishi | 438/464 |
| 7,450,392 B2 | * | 11/2008 | Abe et al. | 361/752 |
| 7,656,680 B2 | * | 2/2010 | Jitsuhara | 361/792 |
| 2007/0077910 A1 | | 4/2007 | Imadate et al. | |
| 2011/0007225 A1 | * | 1/2011 | Kitaguchi | 348/731 |

FOREIGN PATENT DOCUMENTS

| | | |
|---|---|---|
| JP | S 5386467 | 7/1978 |
| JP | H 09148776 | 6/1997 |
| JP | 10-079590 | 3/1998 |
| JP | 2000068673 | 3/2000 |
| JP | 2007097002 | 4/2007 |
| JP | 2009-188956 | 8/2009 |
| JP | 2010-028634 | 2/2010 |
| JP | 2010040682 | 2/2010 |

OTHER PUBLICATIONS

Japanese Patent Application No. 2011-146576, First Office Action, mailed May 15, 2012, (with English Translation).

* cited by examiner

*Primary Examiner* — Hung S Bui
(74) *Attorney, Agent, or Firm* — Blakely, Sokoloff, Taylor & Zafman, LLP

(57) ABSTRACT

According to one embodiment, an electronic device includes a printed circuit board includes a plurality of circuit parts, a conductive shield case provided on the printed circuit board, a tuner provided on the printed circuit board and inside the shield case, a first ground portion provided on the printed circuit board and outside the shield case and a second ground portion provided on the printed circuit board and inside the shield case. The first ground portion is electrically connected to the second ground portion via the shield case.

6 Claims, 6 Drawing Sheets

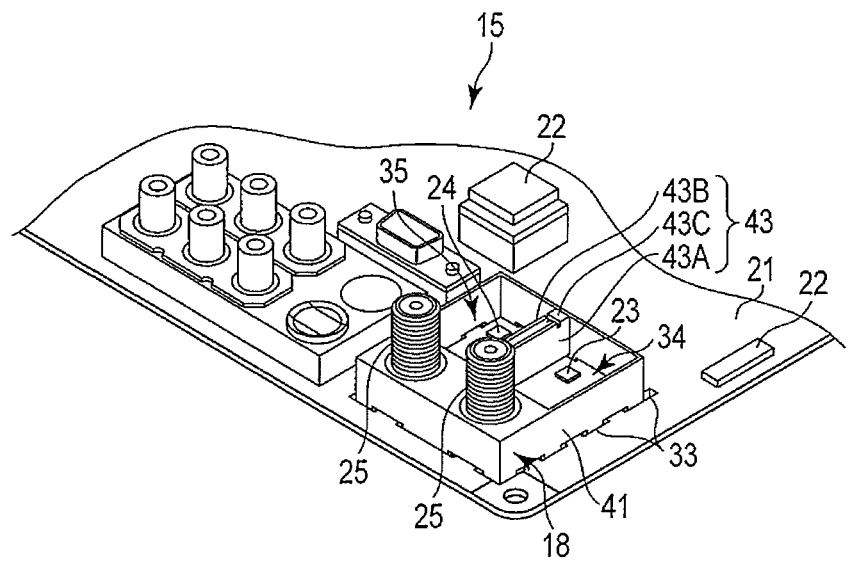
F I G. 4
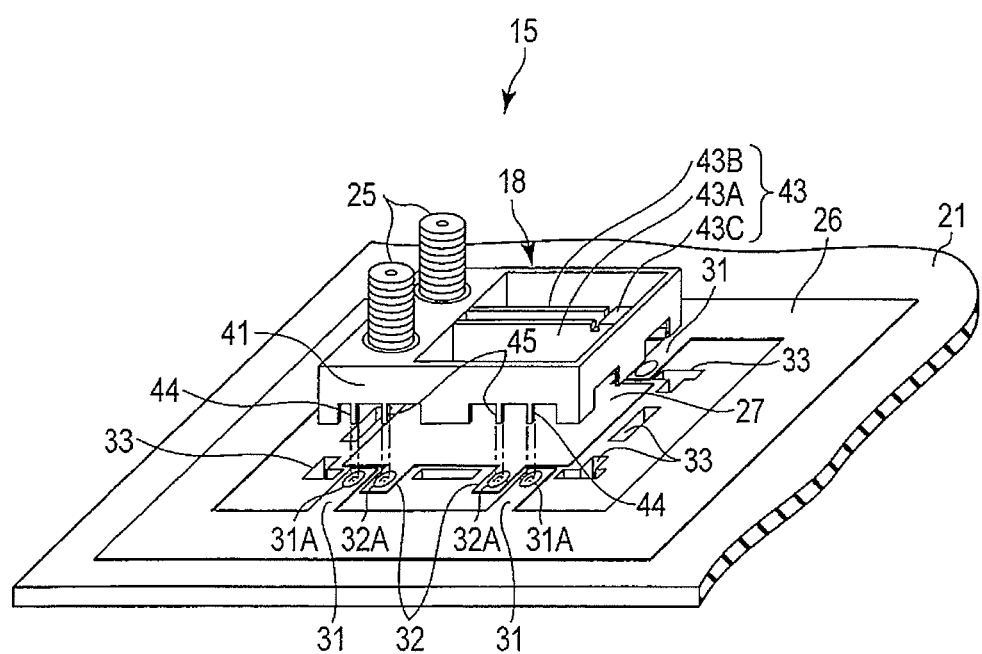
F I G. 5

ELECTRONIC DEVICE AND PRINTED CIRCUIT BOARD

CROSS-REFERENCE TO RELATED APPLICATIONS

This application is based upon and claims the benefit of priority from prior Japanese Patent Application No. 2011-146576, filed Jun. 30, 2011, the entire contents of which are incorporated herein by reference.

FIELD

Embodiments described herein relate generally to an electronic device comprising a tuner and a printed circuit board.

BACKGROUND

There are electronic devices comprising high frequency parts such as tuners, and shield cases.

However, the high frequency parts such as tuners are very susceptible to electromagnetic waves from outer environments. Therefore, there has been a demand for improvements in decreasing the effect of the electromagnetic waves irradiating from outer environments on the frequency parts and in decreasing the electromagnetic waves irradiating from the frequency parts to outer environments in reverse.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is an exemplary perspective view showing the main substrate (printed circuit board) shown in FIG. 2 in the state that a top plate portion of the shield case is removed;

FIG. 5 is an exemplary perspective view showing the main substrate (printed circuit board) shown in FIG. 2 in an exploded state;

DETAILED DESCRIPTION

Various embodiments will be described hereinafter with reference to the accompanying drawings.

In general, according to one embodiment, an electronic device includes a printed circuit board includes a plurality of circuit parts, a conductive shield case provided on the printed circuit board, a tuner provided on the printed circuit board and inside the shield case, a first ground portion provided on the printed circuit board and outside the shield case and a second ground portion provided on the printed circuit board and inside the shield case. The first ground portion is electrically connected to the second ground portion via the shield case.

Figure 1:
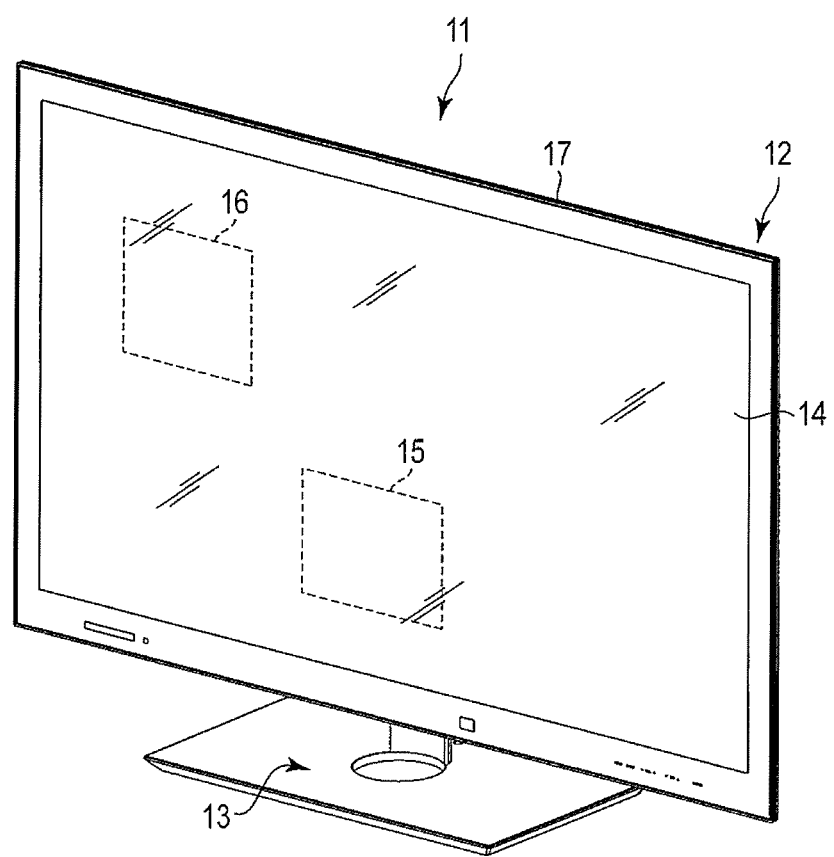
FIG. 1 is an exemplary perspective view showing a television which is an example of the electronic device according to the first embodiment.
Figure 2:
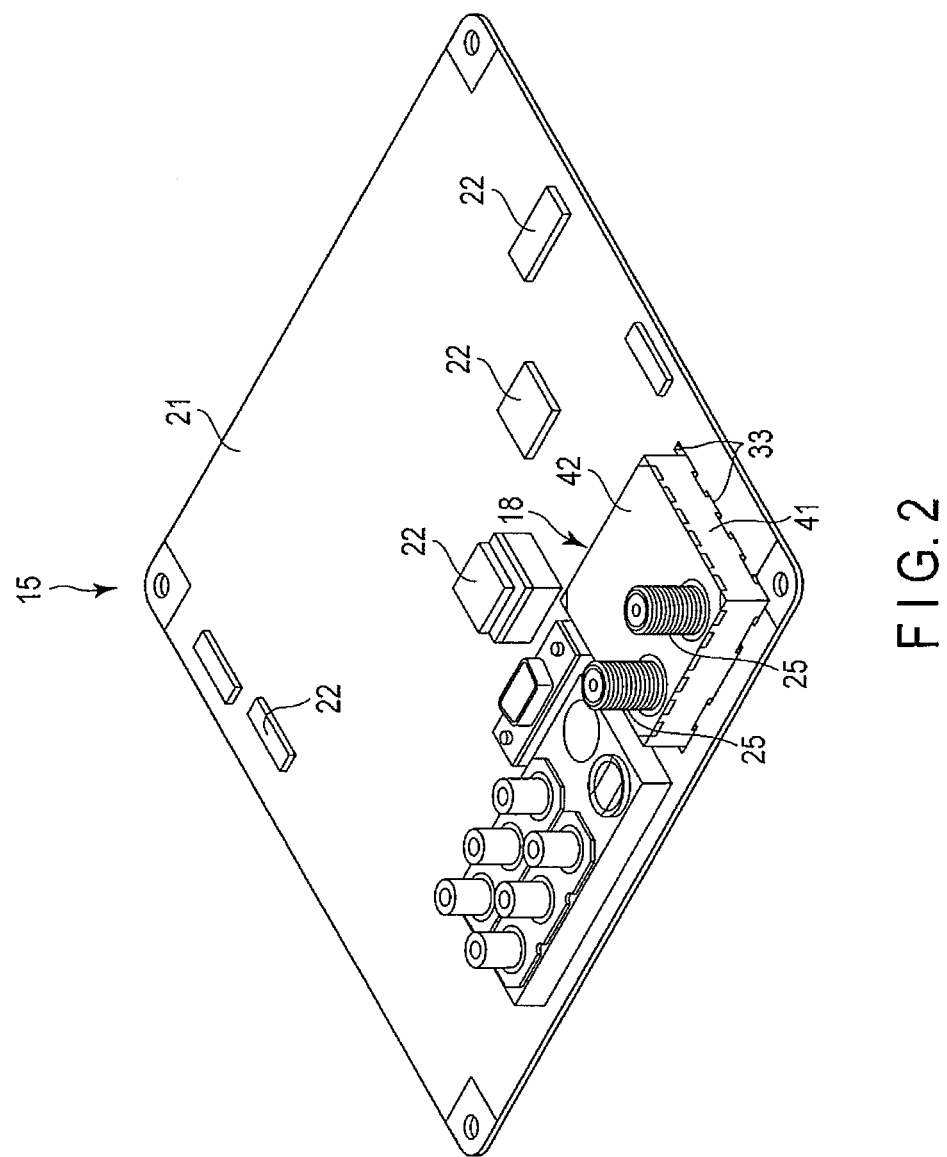
FIG. 2 is an exemplary perspective view showing a main substrate (printed circuit board) of the television shown in FIG. 1 as viewed from the surface direction.
Figure 3:
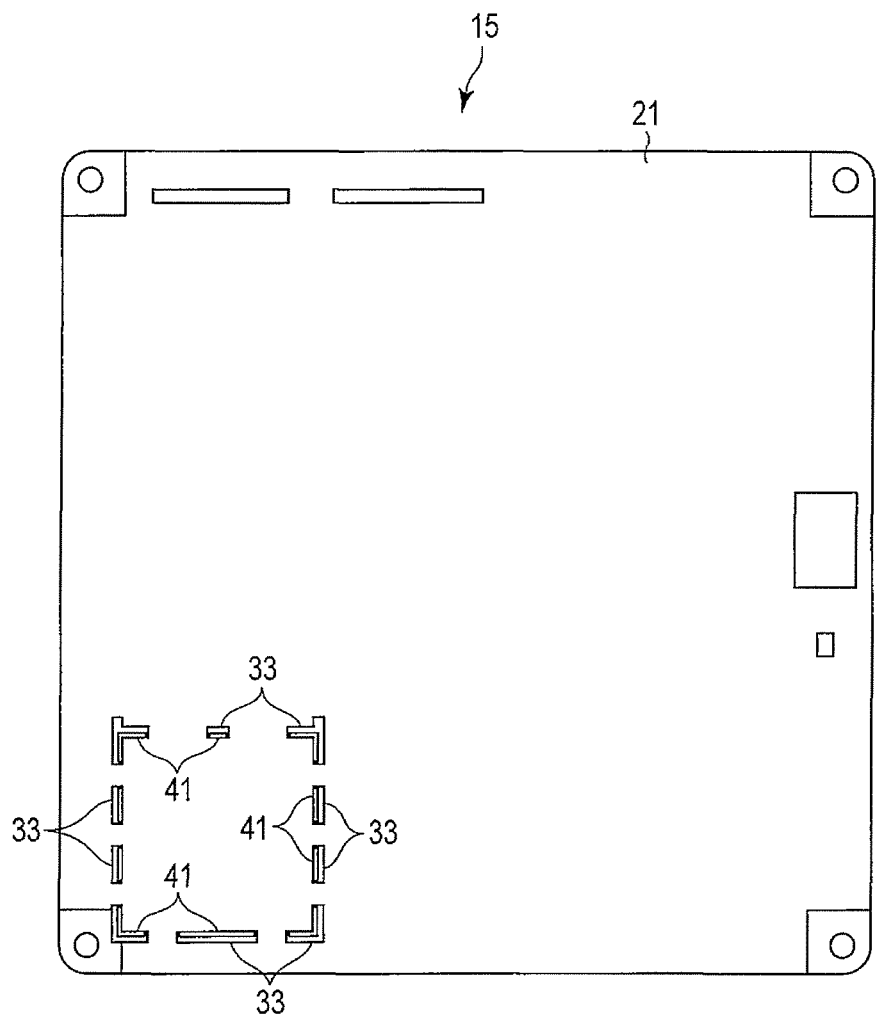
FIG. 3 is an exemplary bottom surface view showing the main substrate (printed circuit board) shown in FIG. 2 as viewed from the rear surface direction.

The first embodiment of the television which is an example of the electronic device will now be described with reference to FIGS. 1 to 6. As shown in FIG. 1, a television 11 of this embodiment is a flat panel display device having a rectangular appearance. As shown in FIG. 1, the television 11 comprises a display unit 12 (display portion) and a stand 13 which is an example of a support portion which supports the display unit 12.

The display unit 12 comprises a display panel 14, a main substrate 15 (printed circuit board) and a power substrate 16, provided on a rear surface of the display panel 14, and a case 17 which covers the surroundings of the display panel 14, the main substrate 15 and the power substrate 16.

In this embodiment, the display panel 14 comprises, for example, a liquid crystal panel having a rectangular plate shape. The display panel 14 may be some other type of display panel such as a plasma display panel or an organic EL panel.

As shown in FIGS. 2 to 5, the main substrate 15 (printed circuit board) comprises a substrate main body 21 having a rectangular plate shape, a plurality of circuit parts 22 (CPU, ROM, RAM and the like) mounted on the substrate main body 21, a first tuner 23 and a second tuner 24 mounted on the substrate main body 21, a shield case 18 provided on the substrate main body 21 such as to surround the first tuner 23 and the second tuner 24, a pair of connection terminals 25 provided to project from an upper portion of the shield case 18, a first ground portion 26 provided on an outer side of the shield case 18, a second ground portion 27 provided on an inner side of the shield case 18, a first projecting portion 31 projecting from the first ground portion 26 to the second ground portion 27, a second projecting portion 32 projecting from the second ground portion 27 to the first ground portion 26 and a plurality of slots 33 having a slender hole shape made in the substrate main body 21. Thus, in this embodiment, the first tuner 23 and the second tuner 24 are mounted on the main substrate 15 (printed circuit broad), and thus a print circuit board for the tuners is not required as a separate unit.

As shown in FIG. 4, the first tuner 23 (tuner) is the so-called high frequency parts, and comprises a part of a receiving circuit (a first receiving circuit 34) for, for example, satellite broadcasting. Similarly, the second tuner 24 (tuner) is the so-called high frequency parts, and comprises a part of a receiving circuit (a second receiving circuit 35) for, for example, terrestrial analog-digital television broadcasting. The first tuner 23 and the second tuner 24 are provided inside the shield case 18.

As shown in FIG. 5, the plurality of slots 33 are arranged at constant intervals such as to surround the second ground portion 27. In other words, the plurality of slots 33 are arranged between the first ground portion 26 and the second ground portion 27, and they partition the region inside the shield case 18 from the other region of the main substrate 15. An inner circumferential face of each slot 33 is coated with an insulative material. The plurality of slots 33 physically serve to isolate the region inside the shield case 18 from the other region of the main substrate 15, and thus they can prevent the electromagnetic waves from entering and exiting between the inner and outer regions of the shield case 18.

Figure 6:
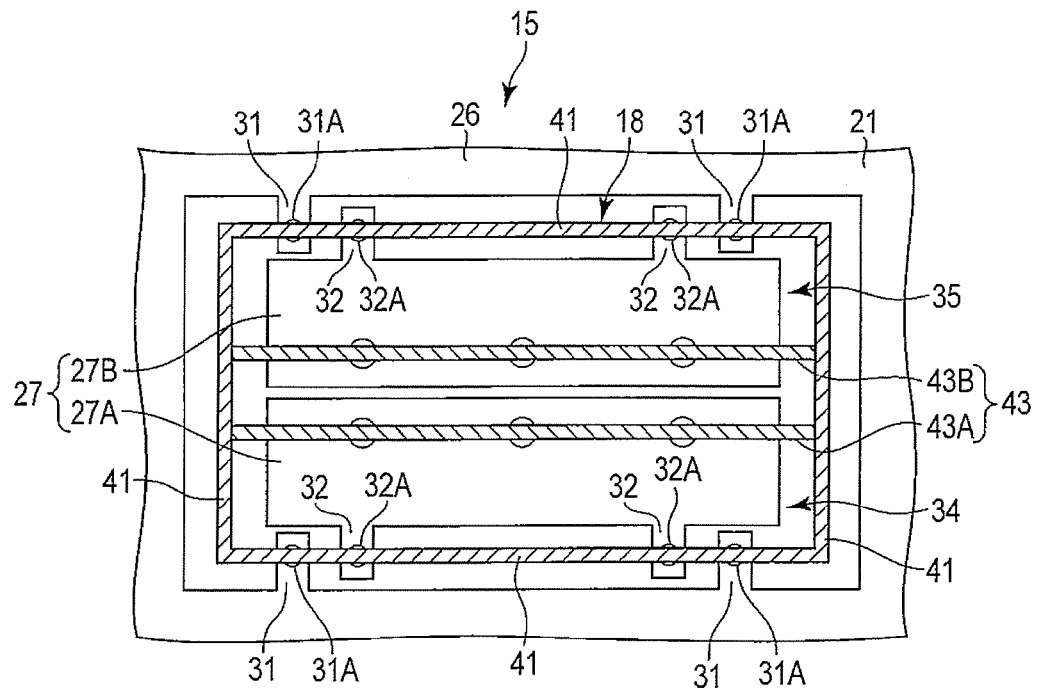
FIG. 6 is an exemplary cross sectional view showing the shield case on the main substrate shown in FIG. 2 as it is sliced in a horizontal direction.

The first ground portion 26 is formed of a conductive layer (a copper thin film) to have a flat surface shape on the substrate main body 21. The first projecting portion 31 is provided on the substrate main body 21 and is electrically connected to the shield case 18. The second ground portion 27 is formed of a conductive layer (a copper thin film) to have a flat surface shape on the substrate main body 21. As shown in FIG. 6, the second ground portion 27 comprises a first part 27A associated with the first tuner 23 (the first receiving circuit 34) and a second part 27B associated with the second tuner 24 (the second receiving circuit 35). The first part 27A is separated from the second part 27B. The second projecting portion 32 is provided on the substrate main body 21 and is electrically connected to the shield case 18.

The shield case 18 is prepared by folding a conductive material, for example, sheet metal (plated steel sheet) into a box shape. The shield case 18 comprises a lateral portion 41 having a frame shape, a top plate portion 42 removable from the lateral portion 41, a partition portion 43 which partition the inside the lateral portion 41 into two regions, and first projections 44 and second projections 45 provided in the lateral portion 41.

As shown in FIGS. 4 and 5, the partition portion 43 is prepared by folding a conductive material, for example, a sheet of metal (plated steel sheet) by a central portion thereof, and thus double-folded shield of two pieces is formed. The partition portion 43 comprises a first piece 43A, a second piece 43B separated therefrom, and a coupling piece 43C which couples the first piece 43A and the second piece 43B. The first piece 43A is electrically connected to the first part 27A of the second ground portion 27 by a pin projecting from the first piece 43A. Similarly, the second piece 43B is electrically connected to the second part 27B of the second ground portion 27 by a pin projecting from the second piece 43B. The partition portion 43 is set between the receiving circuit for satellite broadcasting (the first receiving circuit 34) and the receiving circuit for terrestrial analog-digital television broadcasting (the second receiving circuit 35) such as to partition them from each other. In this manner, it is possible to prevent the electromagnetic waves of these broadcastings from interfering with each other.

As shown in FIG. 5, the first projections 44 protrude towards the first projecting portions 31, and they are put into first through holes 31A formed in the first projecting portions 31, respectively, where the first projections 44 are electrically connected respectively to the first projecting portions 31 with solder. In this manner, the shield case 18 is electrically connected to the first ground portion 26. Meanwhile, the second projections 45 protrude towards the second projecting portions 32, and they are put into second through holes 32A formed in the second projecting portions 32, respectively, where the second projections 45 are electrically connected respectively to the second projecting portions 32 with solder. Thus, in this embodiment, the first ground portion 26 is electrically connected to the second ground portion 27 via the shield case 18.

According to the first embodiment, the television 11 comprises a printed circuit board comprising a plurality of circuit parts 22, a conductive shield case 18 provided on the printed circuit board, a tuner provided on the printed circuit board inside the shield case 18, the first ground portion 26 provided on the printed circuit board on the outer side of the shield case 18 and the second ground portion 27 provided on the printed circuit board on the inner side of the shield case 18, and the first ground portion 26 is electrically connected to the second ground portion 27 via the shield case 18.

With this structure, the tuner can be covered by the shield case 18, and therefore it is possible to prevent the noise of external electromagnetic waves from affecting the tuner, or conversely electromagnetic waves from the tuner from leaking to the outside. Similarly, the electric potentials of the first ground portion 26 and the second ground portion 27 can be equalized, and thus it is possible to prevent electromagnetic waves from irradiating from, for example, the first ground portion 26 towards the second ground portion 27, or conversely from irradiating from the second ground portion 27 towards the first ground portion 26. Further, with the above-described structure, the first ground portion 26 and the second ground portion 27 are electrically connected to each other such as to detour via the shield case 18. In this manner, as compared to the case where the first ground portion 26 and the second ground portion 27 are consecutively formed on the printed circuit board, it is possible to prevent the electromagnetic waves oscillating from, for example, the first ground portion 26 from directly reaching the second ground portion 27, or the electromagnetic waves oscillating from the second ground portion 27 from directly reaching the first ground portion 26. In this manner, the adverse effect caused by the electromagnetic waves can be prevented as much as possible, and therefore a high-performance electronic device can be realized.

Further, the television 11 comprises a plurality of slots 33 made in the printed circuit board at a position between the first ground portion 26 and the second ground portion 27. With this structure, the inner side of the shield case 18 and the outer side thereof can be physically separated from each other, thereby making it possible to prevent the mutual interference by electromagnetic waves between the inner side and the outer side of the shield case 18.

The television 11 comprises the second tuner 24 provided on the printed circuit board inside the shield case 18, and the partition portion 43 provided in the shield case 18 and separating the tuner and the second tuner 24 from each other. With this structure, it is possible to prevent the mutual interference by electromagnetic waves between the tuner and the second tuner. Thus, a high-performance electronic device can be realized.

The television 11 comprises the first projecting portions 31 projecting from the first ground portion 26, the second projecting portions 32 projecting from the second ground portion 27, the first projections 44 provided on the shield case 18 and projecting towards the first projecting portions 31 and electrically connected to the first projecting portions 31, respectively, and the second projections 45 provided on the shield case 18 and projecting towards the second projecting portions 32 and electrically connected to the second projecting portions 32, respectively.

With the above-described arrangement, the structure which connects the first ground portion 26 and the second ground portion 27 to each other such as to detour via the shield case 18 in a simple manner.

Figure 7:
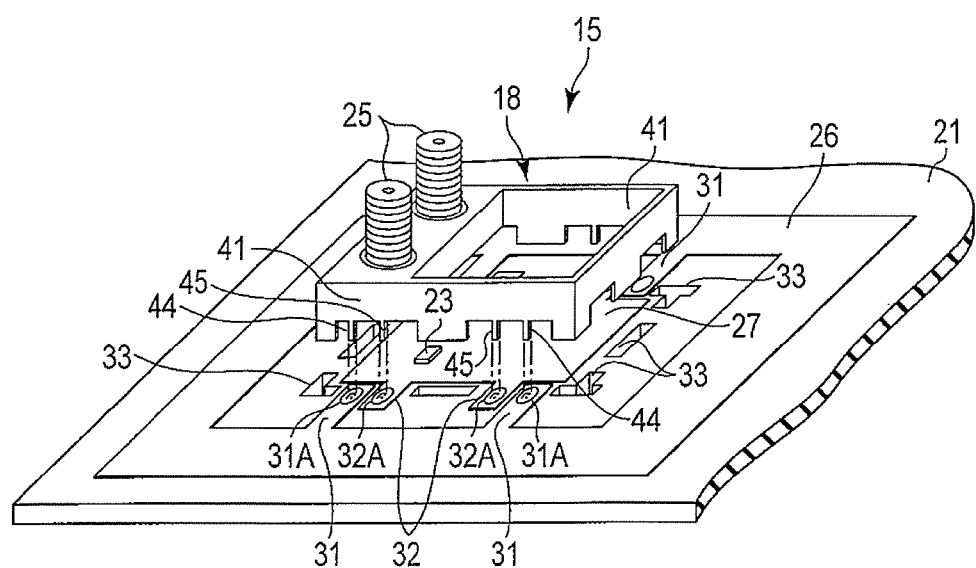
FIG. 7 is an exemplary perspective view showing a main substrate (printed circuit board) of a television which is an example of the electronic device according to the second embodiment in an exploded state.

Subsequently, with reference to FIG. 7, the second embodiment of the electronic device will now be described. The television 11 which is an example of the electronic device of the second embodiment only differs in structure from that of the first embodiment in the respects that the shield case 18 does not comprise the partition portion 43 and in the number of tuners, but the rest of the structure is in common with the first embodiment. Therefore, the different portions of the structure will be explained mainly. In the following explanation, the same structural elements will be designated by the same reference symbols, and the explanations or illustrations therefor will be omitted. The television 11 of the second embodiment has a similar appearance to that shown in FIG. 1.

In the second embodiment, only one first tuner 23 (tuner) is mounted on a main substrate 15 (printed circuit board). The first tuner 23 comprises a part of a receiving circuit (first receiving circuit 34) of, for example, satellite broadcasting.

The shield case 18 is prepared by folding a conductive material, for example, sheet metal (plated steel sheet) into a box shape. The shield case 18 comprises a lateral portion 41 having a frame shape, a top plate portion 42 removable from the lateral portion 41 and first projections 44 and second projections 45 provided in the lateral portion 41.

According to this embodiment, even if there is only one tuner, it is possible to effectively prevent the mutual interference by electromagnetic waves between the inner portion and outer portion of the shield case 18.

Figure 8:
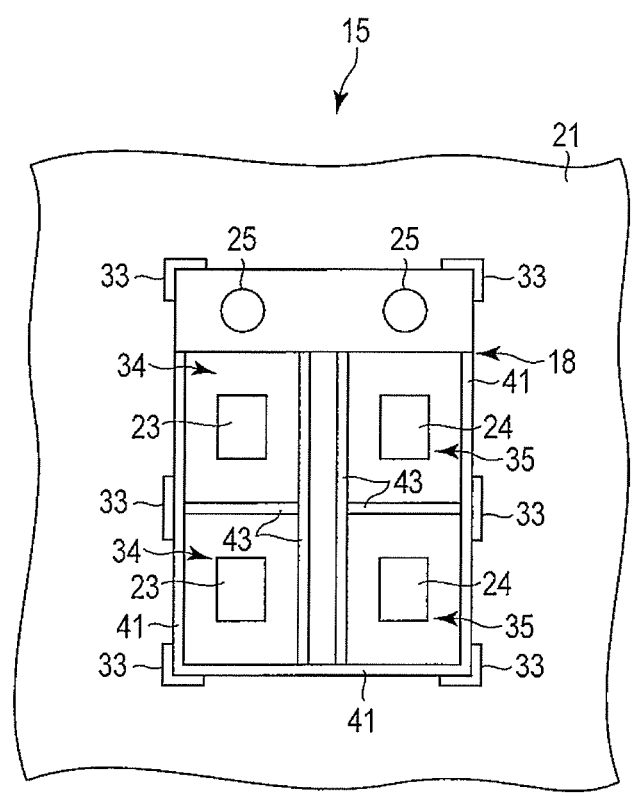
FIG. 8 is an exemplary top view showing a main substrate (printed circuit board) of a television which is an example of the electronic device according to the third embodiment in the state that a top plate portion of the shield case is removed.

Subsequently, with reference to FIG. 8, the third embodiment of the electronic device will now be described. The television 11 which is an example of the electronic device of the third embodiment only differs in structure from that of the first embodiment in the number of tuners, but the rest of the structure is in common with the first embodiment. Therefore, the different portions of the structure will be explained mainly. In the following explanation, the same structural elements will be designated by the same reference symbols, and the explanations or illustrations therefor will be omitted. The television 11 of the third embodiment has a similar appearance to that shown in FIG. 1.

The main substrate 15 (printed circuit board) comprises a substrate main body 21 having a rectangular plate shape, a plurality of first tuners 23 and a plurality of second tuners 24 mounted on the substrate main body 21, a shield case 18 provided on the substrate main body 21 such as to surround the plurality of first tuners 23 and the plurality of second tuners 24, a pair of connection terminals 25 provided to project from an upper portion of the shield case 18, a first ground portion 26 provided on an outer side of the shield case 18, a second ground portion 27 provided on an inner side of the shield case 18, a first projecting portion 31 projecting from the first ground portion 26 to the second ground portion 27, a second projecting portion 32 projecting from the second ground portion 27 to the first ground portion 26 and a plurality of slots 33 having a slender hole shape made in the substrate main body 21.

The shield case 18 comprises a lateral portion 41 having a frame shape, a top plate portion 42 removable from the lateral portion 41, a partition portion 43 which partitions the inner side of the lateral portion 41 (the shield case 18) into 4 regions, and first projections 44 and second projections 45 provided in the lateral portion 41.

Each of the first tuners 23 comprises a part of a receiving circuit (first receiving circuit 34) of, for example, satellite broadcasting. In this embodiment, the number of the first tuners 23 is two, but the embodiment is not limited to this. For example, there may be three or more first tuners 23. On the other hand, each of the second tuners 24 comprises a part of a receiving circuit (a second receiving circuit 35) for, for example, terrestrial analog-digital television broadcasting. In this embodiment, the number of the second tuners 24 is two, but the embodiment is not limited to this. For example, there may be three or more second tuners 24.

According to this embodiment, even if there are a plurality of tuners, it is possible to effectively prevent the mutual interference by electromagnetic waves between the tuners, or between the inner portion and outer portion of the shield case 18.

Further, the electronic device is not limited directly to the above-described embodiment, but it can be realized while remodifying the structural elements thereof within the scope where the essence thereof remains. Further, various types of embodiments can be achieved by combining or rearranging various structural elements disclosed in the embodiment appropriately. For example, some of the structural elements may be deleted from the entire structure disclosed in the embodiment. Further, structural elements of varisou versions may be combined together as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a printed circuit board comprising a plurality of circuit parts;
   a conductive shield case on the printed circuit board;
   a tuner on the printed circuit board and inside the shield case;
   a first ground portion on the printed circuit board and outside the shield case;
   a second ground portion on the printed circuit board and inside the shield case;
   a first projecting portion from the first ground portion;
   a second projecting portion from the second ground portion;
   a first projection on the shield case and projecting towards the first projecting portion and electrically connected to the first projecting portion; and
   a second projection on the shield case and projecting towards the second projecting portion and electrically connected to the second projecting portion,
   wherein the first ground portion is electrically connected to the second ground portion via the shield case.

2. The electronic device of claim 1, further comprising a plurality of slots in the printed circuit board at a position between the first ground portion and the second ground portion.

3. The electronic device of claim 2, further comprising:
   a second tuner on the printed circuit board and inside the shield case; and
   a partition portion in the shield case and separating the tuner and the second tuner from each other.

4. A printed circuit board comprising:
   a board main body comprising a plurality of circuit parts;
   a conductive shield case on the board main body;
   a tuner on the board main body and inside the shield case;
   a first ground portion on the board main body and outside the shield case;
   a second ground portion on the board main body and inside the shield case;
   a first projecting portion from the first ground portion;
   a second projecting portion from the second ground portion;
   a first projection on the shield case and projecting towards the first projecting portion and electrically connected to the first projecting portion; and a second projection on the shield case and projecting towards the second projecting portion and electrically connected to the second projecting portion, wherein the first ground portion is electrically connected to the second ground portion via the shield case.

5. An electronic device comprising:

a conductive shield case on a circuit board;

parts on the circuit board and inside the shield case;

a first ground portion on the circuit board and outside the shield case;

a second ground portion on the circuit board and inside the shield case;

a first projection projecting from the shield case and electrically connected to the first ground portion; and a second projection projecting from the shield case and electrically connected to the second ground portion, wherein the first ground portion is electrically connected to the second ground portion via the shield case.

6. The electronic device of claim 5, further comprising:

a first projecting portion which projects from the first ground portion, and to which the first projection is electrically connected; and a second projection portion which projects from the second ground portion, and to which the second projection is electrically connected.

\* \* \* \* \*